United States Patent
Wickeraad

(10) Patent No.: US 10,761,981 B2
(45) Date of Patent: *Sep. 1, 2020

(54) CONTENT ADDRESSABLE MEMORY

(71) Applicant: Hewlett Packard Enterprise Development LP, Houston, TX (US)

(72) Inventor: John A. Wickeraad, Granite Bay, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/745,452

(22) PCT Filed: Jul. 17, 2015

(86) PCT No.: PCT/US2015/041024
§ 371 (c)(1),
(2) Date: Jan. 17, 2018

(87) PCT Pub. No.: WO2017/014735
PCT Pub. Date: Jan. 26, 2017

(65) Prior Publication Data
US 2018/0210829 A1    Jul. 26, 2018

(51) Int. Cl.
*G06F 12/06* (2006.01)
*G11C 15/00* (2006.01)
*G06F 16/903* (2019.01)

(52) U.S. Cl.
CPC ........ *G06F 12/06* (2013.01); *G06F 16/90339* (2019.01); *G11C 15/00* (2013.01); *G06F 2212/1008* (2013.01)

(58) Field of Classification Search
CPC ............ G06F 12/06; G06F 2212/1008; G06F 16/90339; G11C 15/00
See application file for complete search history.

(56) References Cited

U.S. PATENT DOCUMENTS

| 6,781,857 B1 | 8/2004 | Lien et al. |
| 6,792,502 B1 * | 9/2004 | Pandya ................. G11C 15/00 365/49.18 |

(Continued)

FOREIGN PATENT DOCUMENTS

WO    WO-2013/180950 A2    12/2016

OTHER PUBLICATIONS

International Preliminary Report on Patentability received for PCT Application No. PCT/US2015/041024, dated Feb. 1, 2018, 9 pages.

(Continued)

*Primary Examiner* — Zhuo H Li
(74) *Attorney, Agent, or Firm* — Hewlett Packard Enterprise Patent Department

(57) ABSTRACT

Examples disclosed herein relate, in one aspect, to method of searching a content addressable memory (CAM) that stores a plurality of entries. The method may include obtaining a search word corresponding to a matching data word stored in a matching entry of the CAM, where the matching entry may include a plurality of data words. The method may also include determining, based at least on a value of a predetermined bit of the search word, a search mask to mask off any data words within the matching entry other than the matching data word. The method may also determine, based on the search mask and a search key that includes the search word, the address of the matching entry within the CAM.

20 Claims, 6 Drawing Sheets

(56) References Cited

U.S. PATENT DOCUMENTS

| | | | |
|---|---|---|---|
| 6,839,256 B1 | 1/2005 | Proebsting et al. | |
| 7,050,318 B1 | 5/2006 | Argyres | |
| 7,228,378 B1 * | 6/2007 | Pereira | G11C 15/00 365/49.15 |
| 7,281,085 B1 | 10/2007 | Garg et al. | |
| 10,586,594 B2 * | 3/2020 | Wickeraad | G11C 15/00 |
| 2004/0143701 A1 * | 7/2004 | Giambalvo | G11C 15/00 711/108 |
| 2008/0273362 A1 | 11/2008 | Srinivasan et al. | |
| 2008/0301362 A1 | 12/2008 | Cavanna | |
| 2013/0054886 A1 | 2/2013 | Eshraghian et al. | |
| 2013/0166850 A1 * | 6/2013 | Grover | G06F 12/04 711/154 |
| 2015/0039823 A1 * | 2/2015 | Chen | G06F 16/90339 711/108 |
| 2018/0247694 A1 * | 8/2018 | Wickeraad | G11C 15/00 |

OTHER PUBLICATIONS

Extended European Search Report and Written Opinion received for EP Application No. 15899058.0, dated Oct. 8, 2018, 11 pages.
B Rajendra Naik et al, Low-Area Low-Power and High-Speed TCAMS, 2011, 7 Pgs.
International Searching Authority, the International Search Report and the Written Opinion, dated Apr. 11, 2016, PCT/US2015/041024, 12 Pgs.

* cited by examiner

CONTENT ADDRESSABLE MEMORY

BACKGROUND

A content addressable memory (CAM) is a useful device for executing table lookup operations. Particularly, because of the parallel lookup capability, a device can execute thousands or even millions of comparisons with one lookup operation that may in some cases take no more than a single clock cycle.

BRIEF DESCRIPTION OF THE DRAWINGS

The following detailed description references the drawings, wherein.

DETAILED DESCRIPTION

Figure 1:
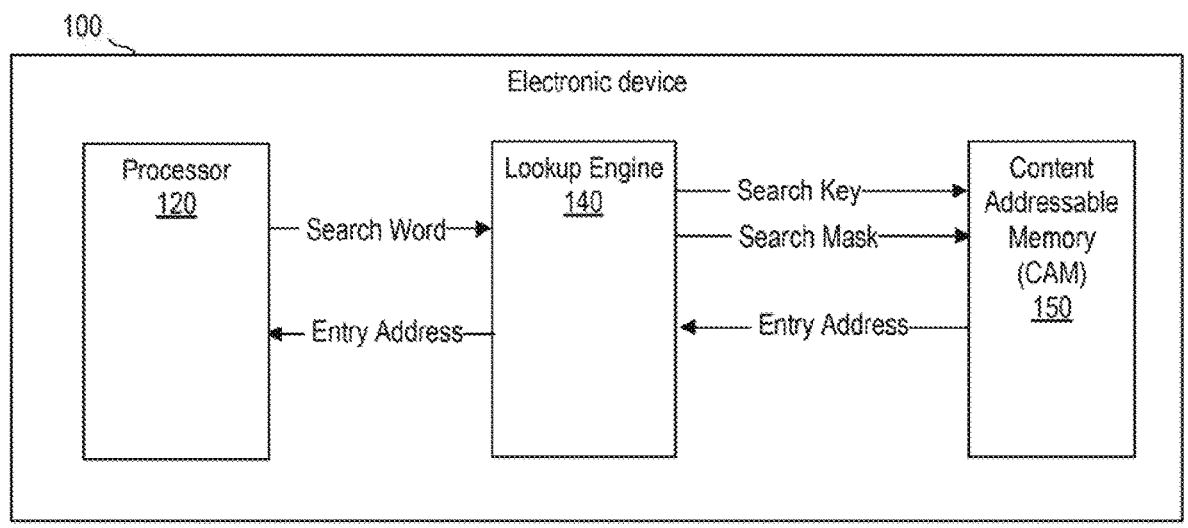
FIG. 1 is a block diagram of an example electronic device.

For computer systems, a CAM is widely used as the address lookup table for cache memory (called cache TAG), or as the paging translation look-aside buffer (TLB). For communication applications, a CAM is used to support address lookup operations for routers. Recently, the rapid growth of networking systems has triggered demand for high density and high speed CAM devices. CAM devices may include binary CAM (BCAM) devices that can only store "0" and "1" bits, and ternary CAM (TCAM) devices that can also store "don't-care" or "X" bits. Accordingly, a BCAM may store fully specified data, such as fully IP addresses, while a TCAM may store fully specified data as well as partially masked data, such as data specifying a sub-network (e.g., 192.168.20.16/22) corresponding to multiple IF addresses. A TCAM may be used to store various items such as quality of service (QoS) information, filter information, access control lists (ACL), longest prefix match (LPM) also known as best match prefix (BMP), etc.

A CAM (e.g., a TCAM or a BCAM) used by a networking application may store, for example, 256 Kilobytes of 140-bit entries, and may support more than 100 million lookups per second (LPS). Due to the parallel lookup operation, however, each lookup may consume vast amounts of power and generate a lot of heat.

A CAM (e.g., a TCAM or a BCAM) may store multiple pieces of data. In some examples, a CAM may include multiple entries, where each entry may have a fixed width (e.g., 140 bits). In some examples, applications may store in a CAM data of varying width. For example, a networking application may store in the CAM internet protocol (IP) addresses of various bit lengths, such as 32-bit long IPV4 addresses, 128-bit long IPV6 addresses, and 64-bit long IPV6 addresses, where "IP address" may include fully-specified IP addresses or partially specified IP addresses, such as sub-network addresses. For better utilization of the memory space, in some examples an application may store a number of data words in the same entry of the CAM. Thus, for example, some entries of the CAM may include only one data word (e.g., one 128-bit IPV6 address); other entries may each include two data words (e.g., two 64-bit IPV6 addresses); yet other entries may each include four data words (e.g., four 32-bit IPV4 addresses); and so forth. It is appreciated that the number of data words included in an entry may or may not be a power of two. In some examples, in addition to the data words, an entry may also include some header information, as will be discussed in more detail below.

In some examples, an application may perform a lookup operation by finding an entry of the CAM that matches a particular search key. The search key may correspond in length to the CAM's entry width (e.g., 140 bits). The application may provide the search key to the CAM, and the CAM may find any entries that match the search key. In some examples, a matching entry may be an entry in which every bit is either equal to a corresponding bit in the search key, or is an "X" bit in the case of a TCAM. In some examples, an application may also provide to the CAM a search mask indicating which bits may be "masked off" and therefore excluded from the comparison. In these examples, a matching entry may be an entry whose every bit is equal to the corresponding bit in the search key or is masked off by the search mask (or is an "X" bit in the case of a TCAM). In some examples, a TCAM may identify two or more matching entries, in which case the TCAM may select a matching entry with the highest priority. For example, the TCAM may store entries having higher priorities at lower addresses than those of entries having lower priorities, and if the TCAM identifies a number of matching entries, it may select the matching entry that has the lowest address.

After identifying the matching entry, the CAM may output (e.g., to a processor or a memory associated with the application) the matching entry's address in the CAM. The address may be used, for example, by a networking application to determine a destination port of a networking device (e.g., a router or a switch) to which to forward data packets addressed to the IP address stored in the matching entry.

Because in some examples some entries may include more than one data word (e.g., more than one IP address), if positions of particular data words within their corresponding entries are unknown or undetermined, an application may perform multiple search operations to find an entry that includes a particular data word. For example, if a CAM entry includes four 32-bit IPV4 addresses at undetermined positions within the entry (e.g., where each address may be stored at one of four possible positions), the application may perform up to four separate lookup operations, changing the position of the data word within the search key and changing the search mask to mask off the remaining three data word positions. Multiple lookup operations may increase the overall lookup latency, decrease throughput, consume more power, and generate more heat, as discussed above.

Examples discussed herein describe, among other things, an electronic device that includes a CAM, a processor, and a lookup engine. The CAM may include a plurality of entries, where each entry may include a set of data words, each data word being positioned within the entry at a position associated with a value of the data word. The lookup engine may obtain a search word from the processor, provide to the CAM a search key that includes the search word and a search mask associated with a value of the search word, and receive from the CAM an address of a matching entry that includes a data word corresponding to the search word.

FIG. 1 is a block diagram of an example electronic device 100. Electronic device 100 may include any type of an electronic device or a combination of electronic devices. For example, electronic device 100 may include a network device (e.g., a network switch, a network router, etc.), a server, a desktop computer, a notebook computer, a tablet computer, a mobile phone, a smartphone, a gaming device, a printing device, and so forth.

Electronic device 100 may include a processor 120. Processor 120 may include one or multiple processors, such as central processing units (CPUs), semiconductor-based microprocessors, hardware state machines, graphics processing units (CPUs), field-programmable gate arrays (FPGAs), or other electronic circuitry, which may be integrated in a single device or distributed across devices. In some examples, processor 120 may also be implemented as a combination of hardware and programming, as will be further discussed below.

Electronic device 100 may also include a content addressable memory (CAM) 150 communicatively coupled to processor 120. CAM 150 and processor 120 may be located on the same physical device or on separate physical devices, e.g., if electronic device 100 is implemented as a number of interconnected physical devices. CAM 150 may include any type of content addressable memory, such as a ternary content addressable memory (TCAM), a binary content addressable memory (BCAM), or any other type of memory capable of storing data entries, receiving a search key, finding an entry matching the search key, and returning the entry's address within the memory.

Electronic device 100 may also include a lookup engine 140 that may be communicatively coupled to processor 120 and TCAM 150. Lookup engine 140 may be implemented as any combination of hardware and processing capable of performing the functionalities discussed below. In some examples, lookup engine 140 may be a part of processor 120 or a part of TCAM 150. In some examples, some of the engine's functionality may be included in (e.g., performed by) processor 120 and/or some of the engine's functionality may be included in (e.g., performed by) TCAM 150.

Figure 2A:
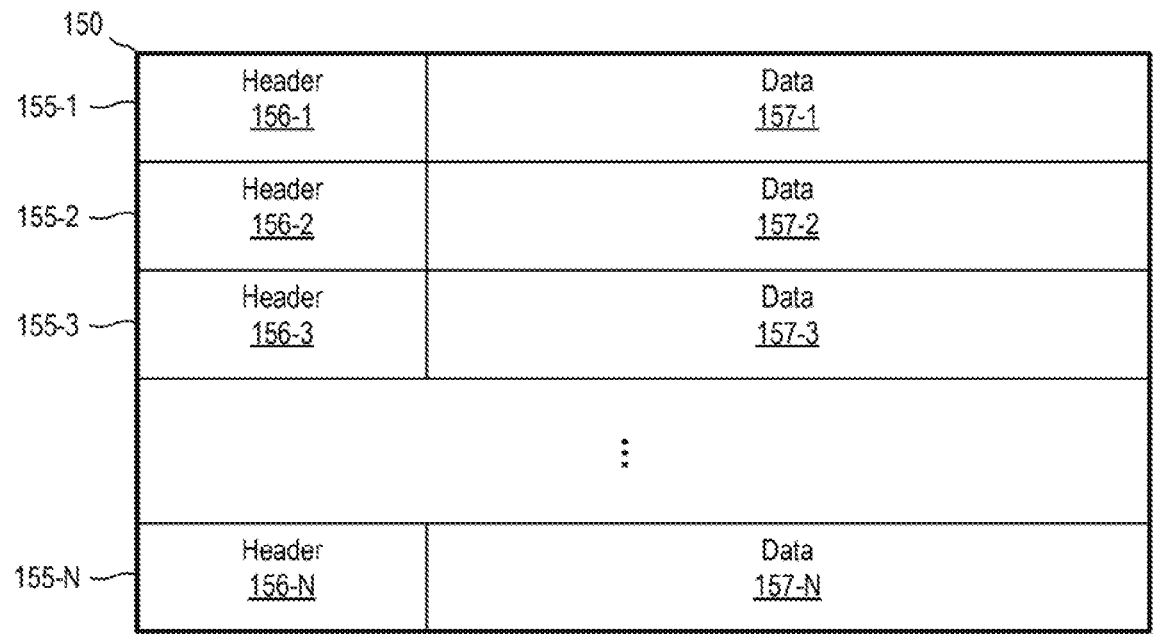
FIG. 2A is a block diagram of an example content addressable memory.

As illustrated in FIG. 2A, in some examples, CAM 150 may include N entries 155, where N may be any integer number greater than one. In some examples, each entry 155 may include a header portion 156 and a data portion 157. Each header portion 156 may include, for example, a set of header fields, and each data portion 155 may include a set of one or more data words.

Figure 2B:
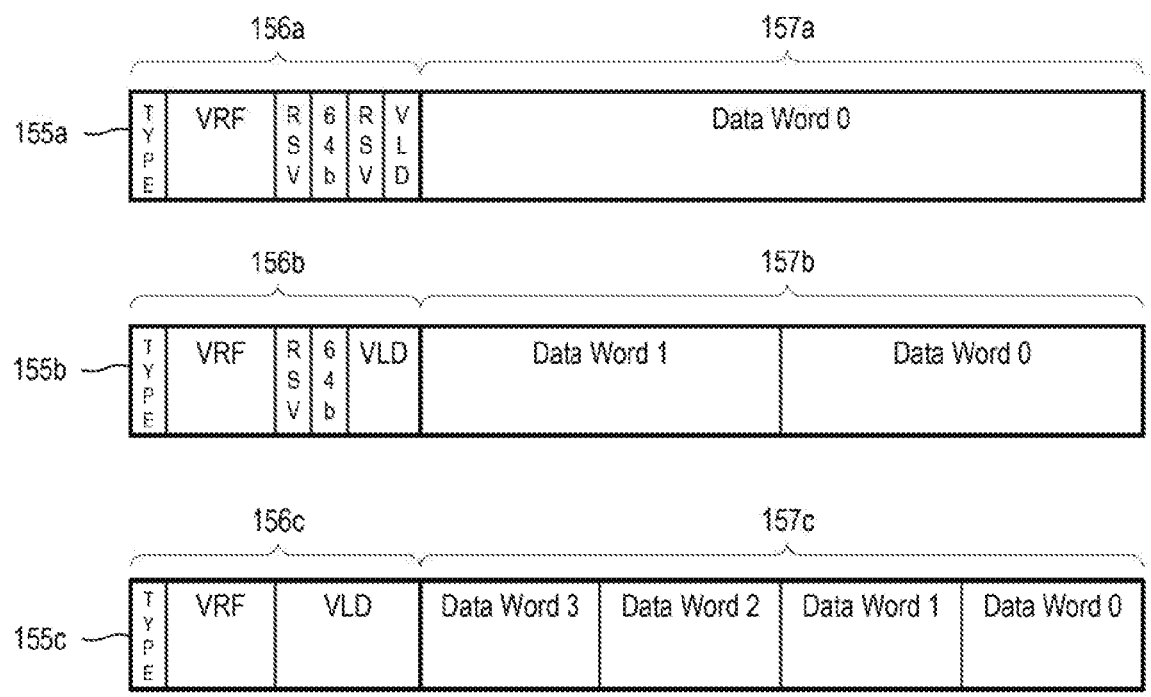
FIG. 2B shows example entries of an example content addressable memory.

To illustrate, FIG. 2B shows three example types of entries 155a, 155b, and 155c that may be stored in CAM 150 and searched by a networking application. It is appreciated that CAM 150 may, in some examples, store any number of any type of entries, and that the entries of various types may be stored in CAM 150 in any order.

As illustrated in FIG. 2B, an entry of type 155a may include one data word (i.e., a set of one data word); an entry of type 155b may include a set of two data words; and an entry of type 155c may include a set of four data words. In some examples, each entry type may have the same length (e.g., 140 bits); the header portion of each entry type may have the same length (e.g., 12 bits); and the data portion of each entry may have the same length (e.g., 128 bits).

FIG. 2B also illustrates that in some examples different types of entries may also include different header information in their header portions 156. For example, each header portion 156 may include a "TYPE" field indicating the type associated with the data portion. For example, the "TYPE" field may indicate whether the data portion contains IPV4 of IPV6 address(es). Entries that include IPV6 (e.g., entries of type 155a or 155b) may also include a "64b" field indicating whether the entry includes a 64-bit IPV6 address. In addition, in some examples, CAM 150 may include entries 155 corresponding to different virtual routing and forwarding tables, in which case each header portion 156 may include a "VRF" field indicating the particular virtual routing and forwarding table to which the entry belongs. Further, each entry 155 may include in its header portion 156 a "VII)" field which may indicate, for each data word in the set of data words, whether that data word is valid. Some entries (e.g., entries of type 155a and 155b) may also include some unused (reserved) bits in their header portions 156, where such bits may be indicated as "RSV."

In some examples, if a data portion 157 includes a set of two or more data words (e.g., 157b and 157c), each data word may be stored at one of predefined locations within the entry (i.e., within the entry's data portion). For example, each data word in data portion 157b may be stored either in bits 63:0 or in bits 127:64; and each data word in data portion 157c may be stored in bits 31:0, bits 63:32, bits 95:64, or bits 127:96. In some examples, each data word may be stored at a position that corresponds or is associated with the data word's value. That is, each data word within CAM 150 (or at least each data words in entries of type 155b or 155c) may be stored at a position (also referred to as a "column" or a "data field") determined based on the data words' value or based at least on the value(s) of one or more of bits of the data word. Thus, the position of each data word within the entry may be a function of at least one of the data word's bits.

For example, when processor 120 provides a new data word to be stored in CAM 150, a position at which the new data word is to be stored within one of the entries 155 of CAM 150 may first be determined. The position may be determined, for example, by processor 120, CAM 150, engine 140, or any other module of electronic device 100. In some examples, the position is determined using a "positioning function" that may obtain one or more bits (in some examples, all bits) of the new data word and calculate the corresponding position based on those bits. The calculated position may be one of predefined positions, or an arbitrary position within the entry's data portion. After determining the position, the new data word may be stored at the determined position within one of entries 155 of CAM 150. In some examples, instead of storing the entire new data word, the new data word may be stored without the bits based on which the position was determined, e.g., if those bits may be determined later based on the position at which the data word is stored within the entry. If these bits do not have to be stored, the width of entries 155 and the overall size of CAM 150 may be reduced, and as a result the cost, power consumption, and complexity of CAM 150 may be further reduced.

Figure 2C:
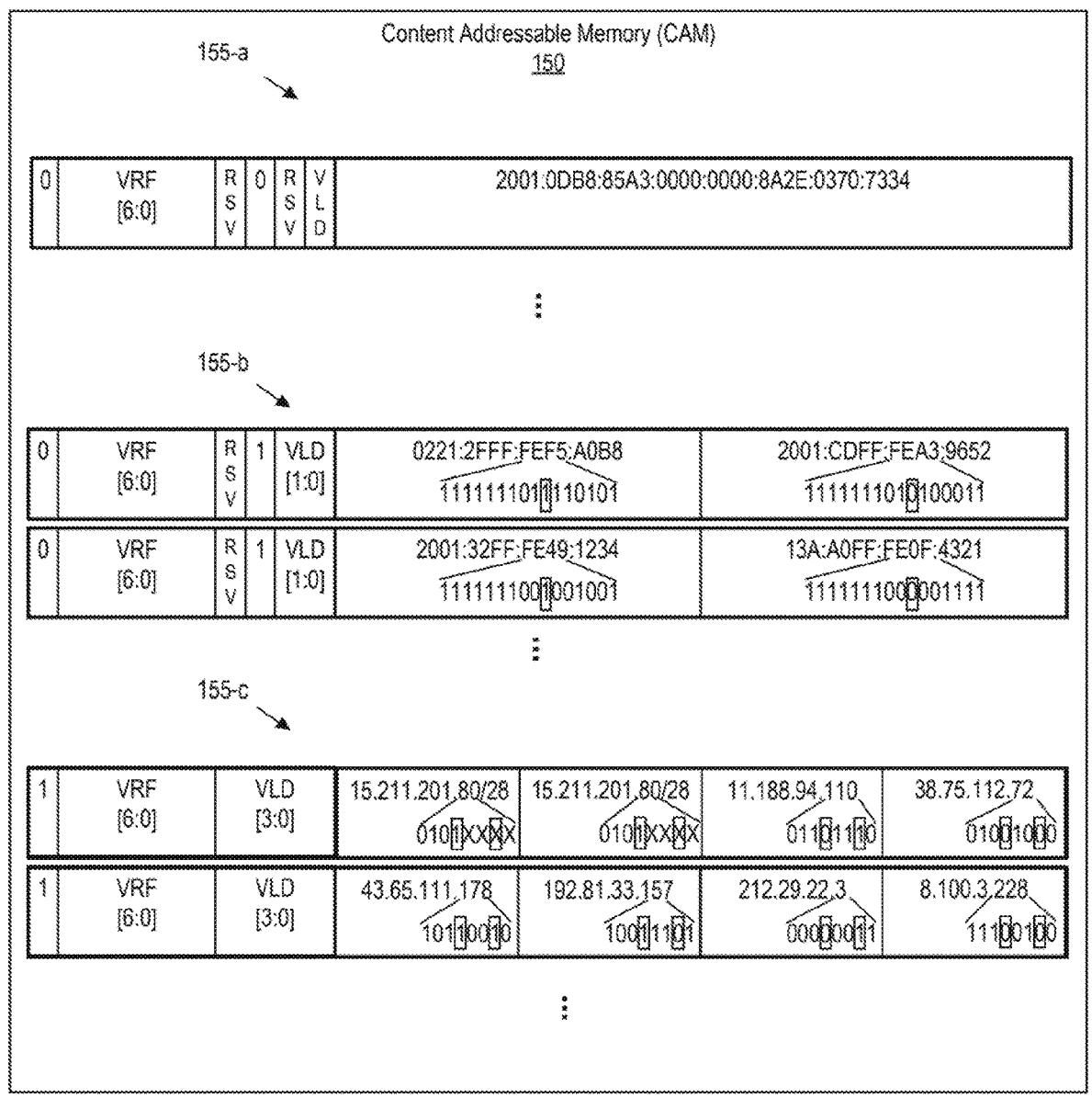
FIG. 2C is another block diagram of an example content addressable memory.

As mentioned above, in some examples the positioning function may determine the position based on a predetermined set of one or more bits of the data word. For example, if the data word is 32-bit long and there are four possible predefined positions for the data word, the positioning function may determine the position based on values of two predetermined bits of the data words. To illustrate, FIG. 2C shows example entries of type 155*b*, each storing two 64-bit data words (e.g., two 64-bit IPV6 addresses), and example entries of type 155*c*, each storing four 32-bit data words (e.g., four 32-bit IPV4 addresses). In this example, the positioning function determined the positions of each 64-bit data word based on bit 38 of the data word, placing data words whose bit 38 is equal to "0" into bits 63:0 of the entry, and data words whose bit 38 is equal to "1" into bits 128-64 of the entry. Similarly, the position of each 32-bit data word in this example was determined based on a combination of bits number 1 and 4 of the data word: combinations of "00", "01", "10", and "11" placed the data words into bits 31:0, 63:32, 95:64, and 127:96, respectively. With regard to entries having a set of only one data word (e.g., entries of type 155*a*), for such entries the position of that data word may be fixed (e.g., bits 127:0) and be independent off values of any bits of the data word.

In the examples discussed above, the positioning function used the minimal number of bits required to deterministically distribute the data words across all entry positions. Specifically, the function in these examples use $\log_2$ E/W bits, where E is the length of the entry's data portion, and W is the length of the data word. It is appreciated, however, that in other examples a positioning function may select a greater number of the data word's bits and perform any types of mathematical or logical operations (e.g., hashing) on the selected bits to calculate the position.

As mentioned above, after determining its position, the data word is stored at that position in one of entries 155 of CAM 150. In some examples, when all entries 155 of CAM 150 already store a data word at the determined position, a new entry 155 may need to be added to CAM 150 even if some entries 155 still have space for the new word at another position. In order to reduce such suboptimal utilization of memory space, the positioning function may be designed or chosen such as to cause an even distribution of the data words across the different positions within the entry, or at least a substantially even distribution where there is only a small percentage (e.g., less than 20%) of underutilized entries 155. This may reduce the total size of CAM 150 needed for storing a given number of data words, thereby also reducing cost, complexity, and/or power consumption of CAM 150.

Therefore, in some examples the positioning function may calculate the position using those bits of the data words that statistically tend to be more evenly distributed, and not use bits that statistically tend to be unevenly distributed. In some examples, the function may be chosen (e.g., by processor 120, CAM 150, engine 140, or any other module of electronic device 100) based on historical data associated with the particular application. As used herein, choosing the function may include choosing the type of the function and/or any of the function's parameters or inputs, such as the predetermined set of bits of the data word that is used by the function to determine the position.

For example, processor 120 may obtain information about data words previously stored in CAM 150 and/or data words that are to be stored in CAM 150, and choose a positioning function that would cause the most even distribution of such data words across the different positions. In some examples, processor 120 may choose a new positioning function based on the data words currently being stored in CAM 150, after which processor 120 may reposition the data words in CAM 150 using the new positioning function, causing a more even distribution of the data words. In other examples, processor 120 may initially be adding a new entry 155 for each new data word, and store the new data word in every possible position within the new entry 155. When CAM 150 reaches maximum capacity and can store no additional entries, processor 120 may choose the positioning function based on the stored data words, and then remove or invalidate any stored data words whose positions are not in accordance with the positioning function. While in the above examples the positioning function is described as being chosen by processor 120, it is appreciated that in some examples this functionality (or parts thereof) may be performed by TCAM 150, engine 140, or any other module of electronic device 100.

In some examples, for example if CAM 150 is a TCAM, some data words in CAM 150 may include "X" bits. In such examples, processor 120 may choose a positioning function that uses data word bits that may not or are less likely to have an "X" value. Such bits may be determined, for example, by analyzing a plurality of previously or currently stored data words, as discussed above. In some examples, if the positioning function uses a bit that nevertheless happens to get the value of "X" in a particular data word, the positioning function may return two positions for that data word: one position corresponding to a bit value of "0", and another position corresponding to a bit value of "1". Such data word may then be stored in both of these positions, as illustrated in the first entry of type 155-*c* in the example of FIG. 2C, where a sub-network address 15.211.201.80/28 (meaning that 28 most significant bits of the word need to match and the 4 least significant bits are "X") is stored in two positions corresponding to two possible values of bit 2. Similarly, if the positioning function uses two bits to determine the position, and both bits happen to have a value of "X" in a given data word, the data word may be stored in four different positions, and so on.

In some examples, processor 120 obtains a search word (e.g., an IP address, or any other type of data word) that needs to be looked up in CAM 150. For example, an application running on processor 120 may request an address of an entry 155 in CAM 150 that includes a data word corresponding to the search word. In some examples, processor 120 may provide the search word to lookup engine 140.

Engine 140 may obtain the search word from processor 120, and based on the search word determine (e.g., select, generate, form, etc.) a search key and a search mask. The search key and search mask may then be provided by lookup engine 140 to CAM 150 (either directly or through processor 120 or another module). CAM 150, upon receiving the search key and search mask may identify at least one matching entry 155, that is, an entry 155 that after being masked by the search mask would correspond to the search key. Thus, the search key may include the search word, as well as any header information that needs to be found in a matching entry 155 of CAM 150.

Figure 3A:
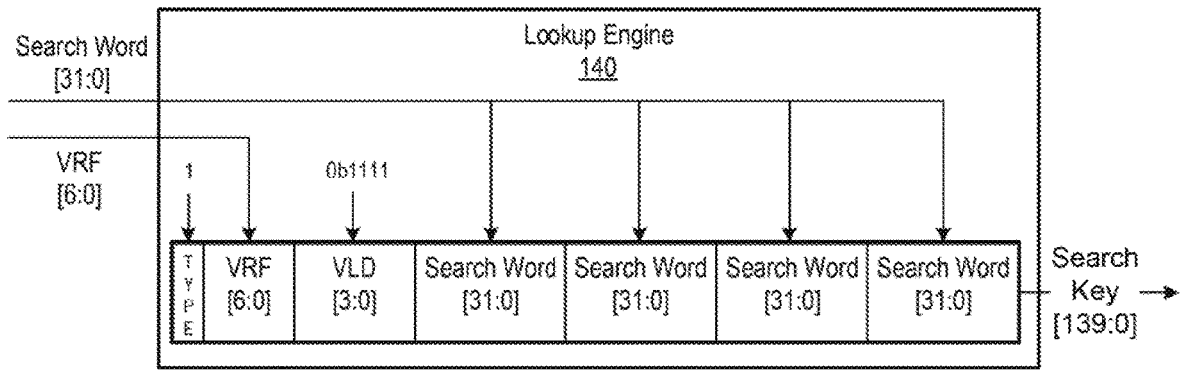
FIG. 3A is another block diagram of an example lookup engine.
Figure 3B:
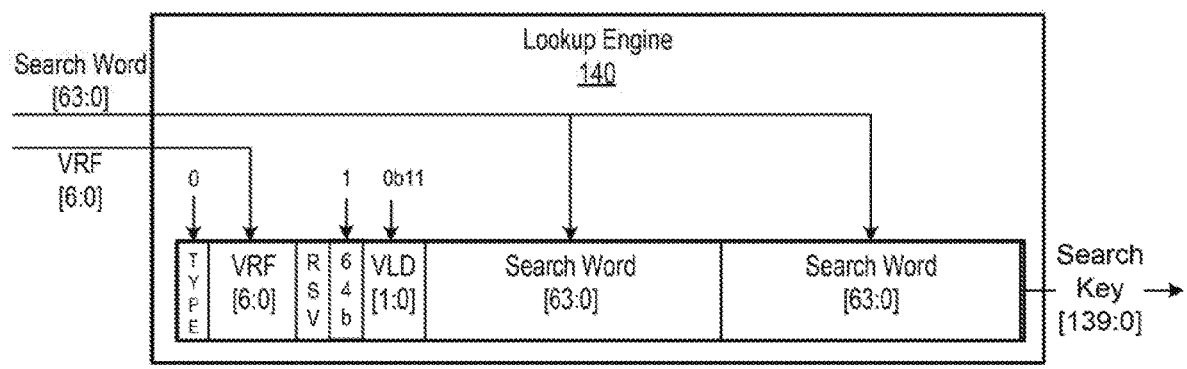
FIG. 3B is another block diagram of an example lookup engine.
Figure 3C:
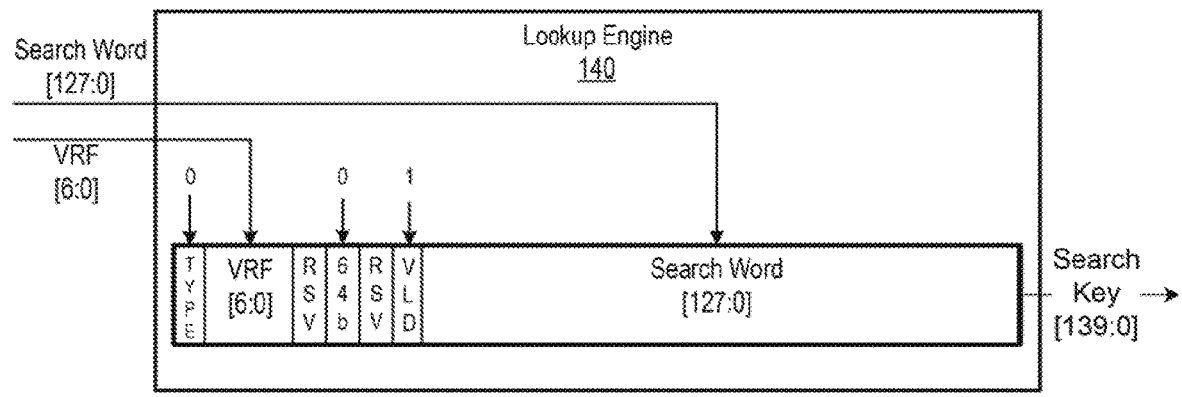
FIG. 3C is another block diagram of an example lookup engine.

In some examples, the search key generated by lookup engine 140 may include the search word in every possible data word position, or at least in a position corresponding to the search word, which may be determined by engine 140, e.g., by using the positioning function discussed above. Engine 140 may further include in the search key any header information that needs to be found in the matching entry. FIGS. 3A, 3B, and 3C schematically illustrate an example lookup engine 140 generating a search key based on a 32-bit, a 64-bit, and a 128-bit search word, respectively. For example, in FIG. 3A, lookup engine 140 receives a 32-bit search word, duplicates the search word and includes it in every position of the search key at which a 32-bit data word could be found in an entry 155 of CAM 150. Engine 140 also sets all VLD bits to "1", indicating that every data words should be valid (or masked off), and sets the TYPE bit to "1", indicating that the matching, entry should include an IPV4 address. In addition, in this example, engine 140 receives (e.g., from processor 120) a VRF value and inserts that value in the appropriate field of the search key.

In the example of FIG. 3B, lookup engine 140 receives a 64-bit search word, duplicates the search word and includes it in every position of the search key at which a 64-bit data word could be found in an entry 155 of CAM 150. Engine 140 also sets all VLD bits to "1", indicating that every data words should be valid (or masked off), sets the TYPE bit to "0", indicating that the matching entry should include an IPV6 address, and sets the "64b" field to "1", indicating that the matching entry should include a 64-bit IPV6 address. In addition, in this example, engine 140 receives (e.g., from processor 120) a VRF value and inserts that value in the appropriate field of the search key.

In the example of FIG. 3C, lookup engine 140 receives a 128-bit search word, and includes it in the only position of the search key at which a 128-bit data word could be found in an entry 155, in accordance with this example. Engine 140 also sets the VLD bit to "1", indicating the data word should be valid (or masked off), sets the TYPE bit to "0", indicating that the matching entry should include an IPV6 address, and sets the "64b" field to "0", indicating that the matching entry should include a 128-bit IPV6 address. In addition, in this example, engine 140 receives (e.g., from processor 120) a VRF value and inserts that value in the appropriate field of the search key.

It is appreciated that the examples of FIGS. 3A, 3B, and 3C are illustrative only, and that engine 140 may also be able, for example, to determine (e.g., automatically or based on an input from processor 120) the type and/or length of the search word and prepare a search key for a search word of any type and/or length.

As mentioned above, in addition to generating the search key, engine 140 may also generate, based on the search word, a search mask. In some examples, to generate the search mask, engine 140 may first determine, based on the value of the search word (or at least one or more of its bits), the position associated with the search word, such as the position (or the "column") within an entry 155 of CAM 150 at which a data word corresponding to the search word would be found.

In some examples, engine 140 may determine the search word's position based on the same positioning function that was used by processor 120 to store data words into CAM 150. Thus, as discussed above, engine 140 may in some examples determine the position based on values of one or more predetermined bits of the search word. After determining the position associated with the search word, engine 140 may determine (e.g., generate or select from predetermined values) a search mask based on the position. In some examples, engine 140 may determine a search mask that would mask off any data words other than the data word positioned at the determined position. In some examples, the outputted mask may further mask off any VLD bits (i.e., bits indicating validity) of the masked off data words. In some examples, the outputted mask may further mask off unused or reserved (e.g., RSV) bits or any other header fields that should not be imposed during the lookup, i.e., any header fields that may be disregarded when searching for a matching entry.

Figure 4A:
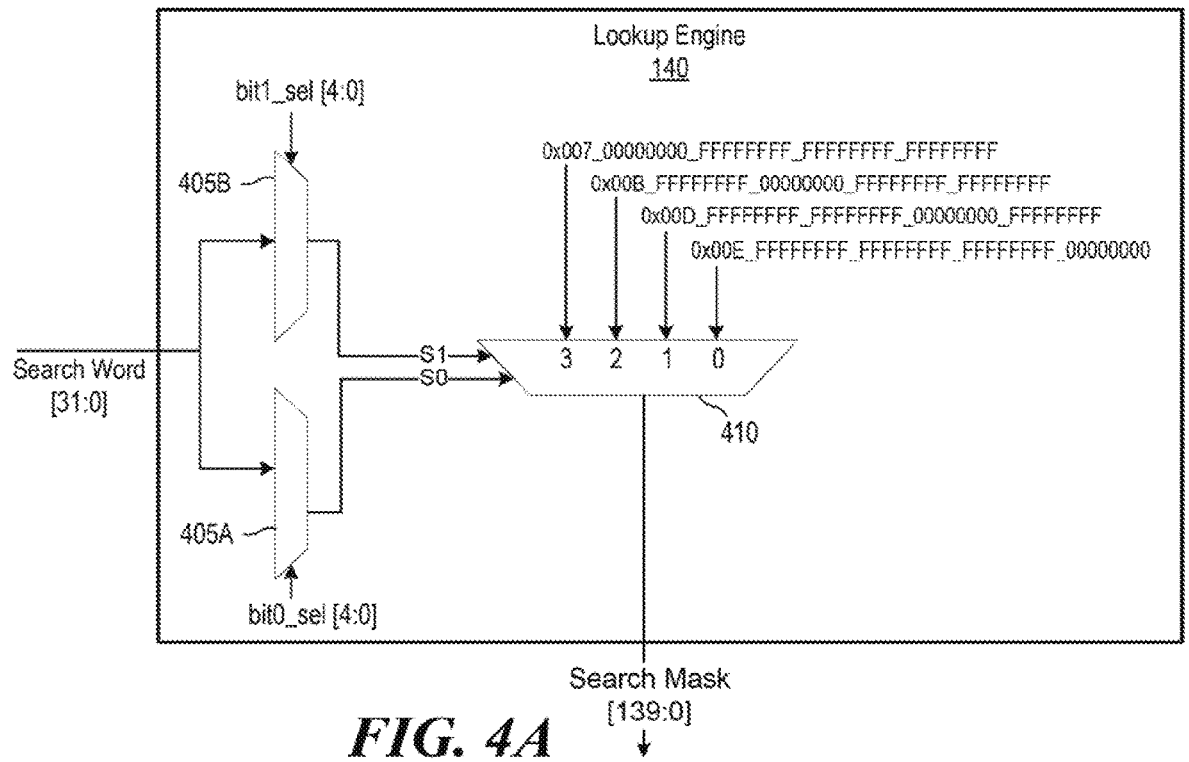
FIG. 4A is another block diagram of an example lookup engine.
Figure 4B:
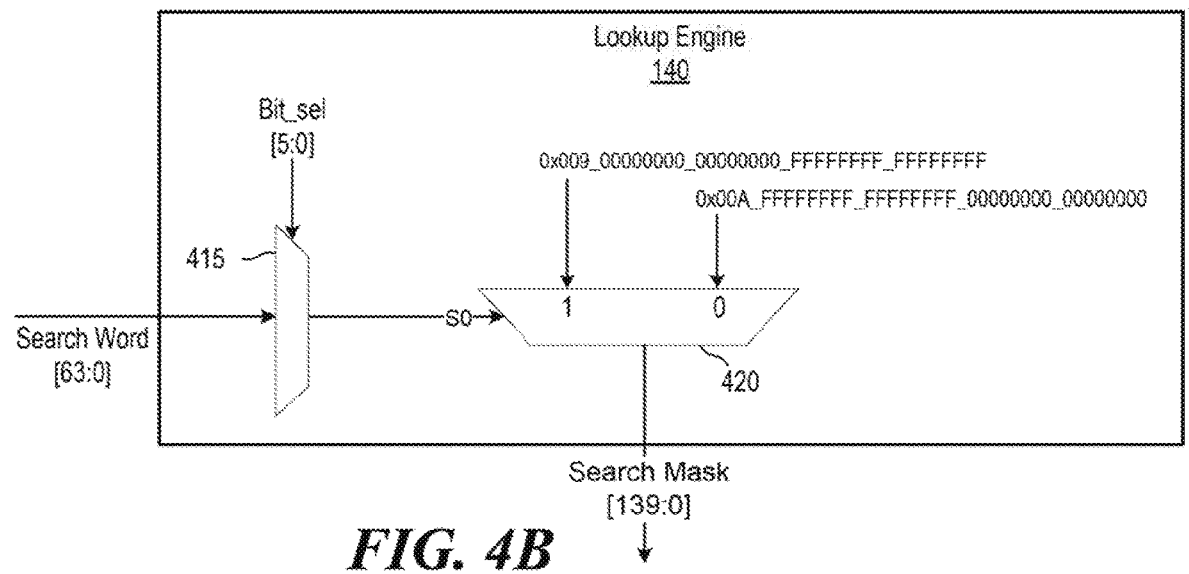
FIG. 4B is another block diagram of an example lookup engine.

FIGS. 4A and 4B schematically illustrate an example engine 140 generating a search mask based on a 32-bit and a 64-bit search word, respectively. For example, in FIG. 4A, engine 140 receives a 32-bit search word (e.g., an IPV4 address), and uses multiplexers 405A and 405B to perform a positioning function that in this example only extract values of two predetermined bits whose positions are defined by signals bit0_sel and bit1_sel, respectively. Engine 140 then provides the two bits to a multiplexer 410 to select and output one of four predefined search masks. In the example of FIG. 4A, bits that need to be masked off and disregarded by CAM 150 during lookup are indicated as logical "1". Therefore, it is appreciated that in this example, each predefined search mask, when applied to an entry 155, will mask off all data words in the entry except for one data word, that data word being different for each mask. Thus, it is appreciated that each of the four masks may cause CAM 150 to compare the search word to a different 32-bit data word of each entry 155, while disregarding the values of the other three 32-bit data words. In the example of FIG. 4A, each search mask also masks off any VLD bits associated with the three data words that are masked off, but does not mask off the VLD bit associated with the unmasked data word, and does not mask off other header fields such as TYPE and VRF.

Similarly, in FIG. 4B, engine 140 receives a 64-bit search word (e.g., a 64-bit IPV6 address), and uses a multiplexer 415 to extract a value of one predefined bit whose position is defined by signal bit_sel. Engine 140 then provides the bit to a multiplexer 420 to select and output one of two predefined search masks, where each mask is designed to cause CAM 150 to compare the search word with one 64-bit data word, while masking off and disregarding the value of the other 64-bit data word. Each search mask also masks off a VLD bit associated with the masked off data word, and masks off the RSV bit, but does not mask off the VLD bit associated with the unmasked data word, and does not mask off other header fields such as TYPE, VRF, and "64b."

It is appreciated that engine 140 may also generate a search mask for a 128-bit search word, such as a 128-bit IPV6 address. In some examples (not illustrated for brevity), when engine 140 obtains a 128-bit data word, engine 140 may output a fixed predetermined search mask (e.g., 0x00A_0000_0000_0000_0000) irrespective of the value of any of the data word's bits.

After determining the search key and the search mask, engine 140 may provide the search key and the search mask to CAM 150, that may perform a lookup operation and output back to engine 140 an address of an entry that, when masked by the search mask, corresponds to the search key, as discussed above. Engine 140 may then pass the address of the entry to processor 120 or to another module, such as a volatile and/or non-volatile memory, not shown in FIG. 1 for brevity.

As mentioned above, in some examples, processors 120 and lookup engine 140 may each be implemented as any combination of hardware and programming. The programming may include processor executable instructions stored on a tangible, non-transitory computer readable medium and the hardware may include a processing resource for executing those instructions. The processing resource, for example, may include one or multiple processors (e.g., central processing units (CPUs), semiconductor-based microprocessors, graphics processing units (GPUs), field-programmable gate arrays (FPGAs) configured to retrieve and execute instructions, or other electronic circuitry), which may be integrated in a single device or distributed across devices. The computer readable medium can store program instructions that when executed by the processor resource implement the functionality of the respective component. The computer readable medium may be integrated in the same device as the processor resource or it may be separate but accessible to that device and the processor resource. In one example, the program instructions can be part of an installation package that when installed can be executed by the processor resource to implement the corresponding component. In this case, the computer readable medium may be a portable medium such as a CD, DVD, or flash drive or a memory maintained by a server from which the installation package can be downloaded and installed. In another example, the program instructions may be part of an application or applications already installed, and the computer readable medium may include integrated memory such as a hard drive, solid state drive, or the like.

Figure 5:
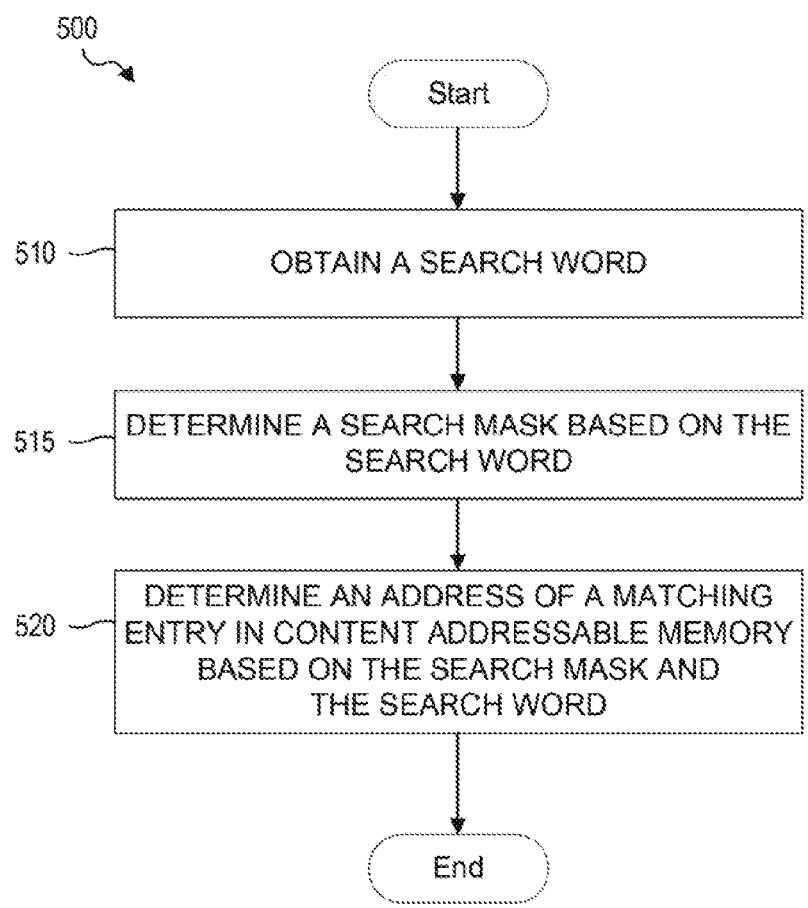
FIG. 5 is a flowchart of an example method for searching a content addressable memory.

FIG. 5 is a flowchart of an example method 500 for searching a content addressable memory (e.g., CAM 150) storing a plurality of entries. Method 500 may be described below as being executed or performed by a one or more modules of an electronic device (e.g., 100). Other suitable systems and/or electronic devices may be used as well. Method 500 may be implemented in the form of executable instructions stored on at least one non-transitory machine-readable storage medium of the electronic device and executed by at least one processor of the electronic device. Alternatively or in addition, method 500 may be implemented in the form of electronic circuitry (e.g., hardware). In alternate examples of the present disclosure, one or more or blocks of method 500 may be executed substantially concurrently or in a different order than shown in FIG. 5. In alternate examples of the present disclosure, method 500 may include more or less blocks than are shown in FIG. 5. In some examples, one or more of the blocks of method 500 may, at certain times, be ongoing and/or may repeat.

At block 510, method 500 may obtaining a search word corresponding to a matching data word stored in a matching entry (e.g., 155) of the CAM (e.g., 150), wherein the matching entry includes a plurality of data words. At block 515, the method may determine, based at least on a value of a predetermined bit of the search word, a search mask to mask off any data words within the matching entry other than the matching data word. As discussed above, the predetermined bit may be determined based on a length of the search word, and determining the search mask may include selecting the search mask from at least two search masks corresponding to different values of the predetermined bit. At block 520, the method may, based on the search mask and based on a search key that includes the search word, determine the address of the matching entry within the CAM, where the search key may be generated based on the search word, as discussed above. Further, as discussed above, in some examples the method may include obtaining a new data word, determining a new position based at least on the predetermined bit of the new data word, and storing the new data word at the new position within one of the CAM's entries.

The invention claimed is:

1. An electronic device comprising:
a content addressable memory (CAM) comprising a plurality of entries, wherein a respective entry comprises a set of data words, and wherein a respective data word is positioned within the entry at a position associated with a value of the data word;
a processor; and
a lookup engine configured to:
obtain a search key comprising a search word and a search mask that indicates a position of the search word among positions of the set of data words within an entry of the CAM based on a value of the search word;
lookup the search word in the plurality of entries of the CAM at the position indicated by the search mask; and
retrieve, from the position indicated by the search mask within a matching entry of the CAM, a data word corresponding to the search word.

2. The electronic device of claim 1, wherein the lookup engine is further configured to select the search mask from a plurality of search masks based on one or more of: a value of a predetermined bit of the search word and a length of the search word.

3. The electronic device of claim 1, wherein a respective position in the positions of the set of data words of a respective entry of the plurality of entries is determined based at least on a value of a predetermined bit of the data word.

4. The electronic device of claim 3, wherein the predetermined bit is determined based on a plurality of data words stored in the CAM.

5. The electronic device of claim 1, wherein looking up the search word in the plurality of entries of the CAM further comprises masking off any data word in the matching entry other than the data word corresponding to the search word.

6. The electronic device of claim 1, wherein the plurality of entries comprise at least two entries with different numbers of data words.

7. The electronic device of claim 1, wherein the CAM comprises a ternary content addressable memory (TCAM), and wherein the plurality of entries include at least two of:
an entry comprising one 128-bit data word;
an entry comprising two 64-bit data words; and
an entry comprising four 32-bit data words.

8. A method of searching a content addressable memory (CAM) storing a plurality of entries, the method comprising:
storing, in the CAM, a plurality of entries, wherein a respective entry comprises a set of data words, and wherein a respective data word is positioned within the entry at a position associated with a value of the data word;
obtaining a search key comprising a search word and a search mask that indicates a position of the search word among positions of the set of data words within an entry of the CAM based on a value of the search word;
looking up the search word in the plurality of entries of the CAM at the position indicated by the search mask; and
retrieving, from the position indicated by the search mask within a matching entry of the CAM, a data word corresponding to the search word.

9. The method of claim 8, further comprising:
obtaining a new data word;
based at least on a predetermined bit of the new data word, determining a bit-level position in an entry of the CAM; and
storing the new data word at the bit-level position in one of the plurality of entries of the CAM.

10. The method of claim 8, wherein the predetermined bit is determined based on one or more of: a plurality of data words stored in the CAM and a length of the search word.

11. The method of claim 8, wherein determining the search mask comprises selecting the search mask from at least two search masks based at least on a value of a predetermined bit of the search word.

12. A content addressable memory (CAM) storing a plurality of entries, wherein a respective entry comprises a set of data words, and wherein a respective data word is positioned within the entry at a position associated with a value of the data word, and wherein the CAM is configured to:
- obtain a search key comprising a search word and a search mask that indicates a position of the search word among positions of the set of data words within an entry of the CAM based on a value of the search word;
- lookup the search word in the plurality of entries of the CAM at the position indicated by the search mask; and
- retrieve, from the position indicated by the search mask within a matching entry of the CAM, a data word corresponding to the search word.

13. The CAM of claim 12, wherein the plurality of entries comprise at least two entries with different numbers of data words.

14. The CAM of claim 12, wherein a respective position in the positions of the set of data words of a respective entry of the plurality of entries is determined based at least on a value of a predetermined bit of the data word.

15. The CAM of claim 12, wherein the CAM is further configured to:
- find the matching entry in response to the matching entry being associated with a higher priority than that of a second matching entry.

16. The electronic device of claim 1, wherein the lookup engine is further configured to:
- obtain a new data word;
- based at least on a predetermined bit of the new data word, determine a bit-level position in an entry of the CAM; and
- store the new data word at the bit-level position in one of the plurality of entries of the CAM.

17. The electronic device of claim 1, wherein the lookup engine is further configured to find the matching entry in response to the matching entry being associated with a higher priority than that of a second matching entry.

18. The method of claim 8, wherein the plurality of entries comprise at least two entries with different numbers of data words.

19. The method of claim 8, wherein the CAM comprises a ternary content addressable memory (TCAM), and wherein the plurality of entries include at least two of:
- an entry comprising one 128-bit data word;
- an entry comprising two 64-bit data words; and
- an entry comprising four 32-bit data words.

20. The method of claim 8, further comprising finding the matching entry in response to the matching entry being associated with a higher priority than that of a second matching entry.

* * * * *